US006236847B1

(12) United States Patent
Stikvoort

(10) Patent No.: US 6,236,847 B1
(45) Date of Patent: *May 22, 2001

(54) RECEIVER AND FILTER ARRANGEMENT COMPRISING POLYPHASE FILTERS

(75) Inventor: Eduard F. Stikvoort, Eindhoven (NL)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/050,594

(22) Filed: Mar. 30, 1998

(30) Foreign Application Priority Data

Apr. 7, 1997  (EP) .................................. 97201017

(51) Int. Cl.[7] ....................................... H04B 1/26
(52) U.S. Cl. .................. 455/313; 455/307; 455/190.1
(58) Field of Search .............................. 455/313, 76, 118, 455/306, 130, 131, 302, 307, 334, 575, 188.1, 190.1; 380/9

(56) References Cited

U.S. PATENT DOCUMENTS

| 4,434,508 | * | 2/1984 | Sommer | 455/306 |
| 4,696,055 | * | 9/1987 | Marshall | 455/118 |
| 4,723,318 |   | 2/1988 | Marshall | 455/109 |
| 5,300,838 |   | 4/1994 | Elizondo | 307/521 |
| 5,715,529 | * | 2/1998 | Klamush et al. | 455/266 |
| 5,764,708 | * | 6/1998 | Glass | 375/340 |
| 5,949,878 | * | 9/1999 | Burdge et al. | 380/9 |
| 5,960,364 | * | 9/1999 | Dent | 455/552 |

OTHER PUBLICATIONS

"High performance direct conversion" By R. Green and R. Hosking. Electronic Word, pp. 18–22, Jan. 1996.*
"High Performance Direct Conversion" By R. Green and R. Hoskins in Electronics World, Jan. 1996, PP. 18–22.

* cited by examiner

Primary Examiner—Daniel Hunter
Assistant Examiner—C. Chow
(74) Attorney, Agent, or Firm—Dicran Halajian

(57) ABSTRACT

In a receiver the input signal is converted by a mixer into two quadrature IF signals. The quadrature IF signals are amplified by an amplifier and filtered by a filter. A polyphase filter suppresses signals having frequencies above a predetermined frequency. A second mixer converts the filtered IF signal into a second IF signal. This second IF signal is filtered by a second polyphase filter which suppresses signals having a frequency below a predetermined frequency. In this way a band-pass transfer function is obtained having a first edge defined by the first polyphase filter and having the second defined by the second polyphase filter. In an embodiment of the invention, the cut off frequencies of the polyphase filters are equal to zero, resulting in a transfer function for the complete receiver having cut off frequencies independent from the component values use in the polyphase filters.

12 Claims, 4 Drawing Sheets

RECEIVER AND FILTER ARRANGEMENT COMPRISING POLYPHASE FILTERS

FIELD OF THE INVENTION

The invention is related to a receiver comprising a frequency converter for deriving from the input signal of the receiver a plurality of intermediate polyphase signals, the receiver further comprises a polyphase filter for deriving filtered polyphase signals from the intermediate polyphase signals. The invention is also related to a filter arrangement using frequency conversion means and a polyphase filter.

BACKGROUND OF THE INVENTION

Such a receiver and filter arrangement are known from U.S. Pat. No. 4,723,318. In receivers an RF signal is down converted to an IF frequency substantially lower than said RF frequency in order to make it possible to obtain a good adjacent channel selectivity with easy realizable filters. A problem associated with this down conversion is the sensitivity of the receiver for so-called image signals. If the signal to be received has a frequency of $f_{RF}$, the local oscillator to be used in the frequency conversion means has a frequency $f_{LO}$ and the IF frequency is equal to $f_{LO}-f_{RF}$, the receiver receives also RF signals with a frequency of $f_{LO}+f_{IF}$, causing interference to the reception of the desired RF signal with frequency $f_{RF}$.

In order to suppress this undesired effect, often an RF filter is used in front of the frequency conversion means to suppress RF signals with a frequency of $f_{LO}+f_{IF}$. This RF filter can be quite expensive.

In the receiver according to the above mentioned US patent, a so called polyphase filter is used for filtering the output signal of the frequency conversion means. Polyphase filters can make use of multiple phase shifted input signals (to be provided by the frequency conversion means) to produce asymmetric transfer functions enabling suppression of signals at the image frequency without requiring an RF filter. The polyphase filter according to the above mentioned US patent is designed for suppressing a signal at an image frequency.

SUMMARY OF THE INVENTION

The object of the present invention is to provide a receiver in which beside the image rejection also the adjacent channel selectivity is realized in a very cost effective way.

Therefor the invention is characterized in that the receiver comprises a further frequency converter for deriving a plurality of further intermediate polyphase signals from the filtered polyphase signals, the receiver comprises a further polyphase filter for deriving further filtered polyphase signals from the further intermediate polyphase signals, one of the polyphase filter and the further polyphase filter being arranged for attenuating signals above a first frequency, and one of the polyphase filter and the further polyphase filter being arranged for attenuating signals below a second frequency.

By using these measures it becomes possible to obtain a receiver with an asymmetric band pass transfer function. The first frequency converter with associated polyphase filter can suppress one part of the input spectrum (e.g. all frequencies below a frequency $f_1$) by choosing suitable values for the IF frequency and the first frequency of the (first) polyphase filter, and the second frequency converter with associated polyphase filter can suppress another part of the input spectrum (e.g. all frequencies above a frequency $f_2<f_1$) so that a band pass transfer function is obtained suitable for realizing the adjacent channel selectivity.

It is observed that the article "High performance direct conversion" by R. Green and R. Hoskins in Electronics World, January 1996, pp. 18–22 discloses a receiver in which two polyphase filters are used. However this document does not use a combination of a first polyphase filter suppressing frequencies above (below) a certain frequency, and a second polyphase filter suppressing frequencies below (above) a certain frequency. The absence of said combination results in a spectrum inversion to take place in said receiver, which is in general undesirable in receivers used for receiving digital signals.

An embodiment of the invention is characterized in that the first frequency and the second frequency are substantially zero.

By using polyphase filters with a cut off frequency of substantially zero, it is obtained that this cut off frequency does not depend on the values of the components used in said polyphase filter. The cut off frequency of the combination of frequency converter and polyphase filter is now only determined by the frequency of the local oscillator used in the frequency converter. Because said frequency can be set very accurately, it becomes possible to realize very accurate filters in a cost effective way.

A further embodiment of the invention is characterized in that the first polyphase filter and the second polyphase filter comprise passive filters.

The use of passive filters does not require active elements such like opamps, resulting in lower costs, and often in a more stable operation of the receiver.

A still further embodiment of the invention is characterized in that the first polyphase filter and the second polyphase filter comprise passive filters using capacitors and resistors.

Using passive filters with resistors and capacitors results in a receiver which can easily be realized in standard IC technologies, resulting a very cost effective solution.

A still further embodiment of the invention is characterized in that the further frequency conversion means comprise image rejection mixing means.

By employing an image rejection mixer in the further frequency converter, it becomes possible to choose the intermediate polyphase signal and the further intermediate polyphase signal in the same frequency range without requiring expensive image rejection filters. The possibility to choose the intermediate polyphase signals and the further intermediate polyphase signals in the same frequency range enables the realization of receivers having a narrow IF bandwidth without requiring expensive band-pass filters.

BRIEF DESCRIPTION OF THE DRAWINGS

The invention will now be explained with reference to the drawings. Herein shows.

DETAILED DESCRIPTION OF THE INVENTION

Figure 1:
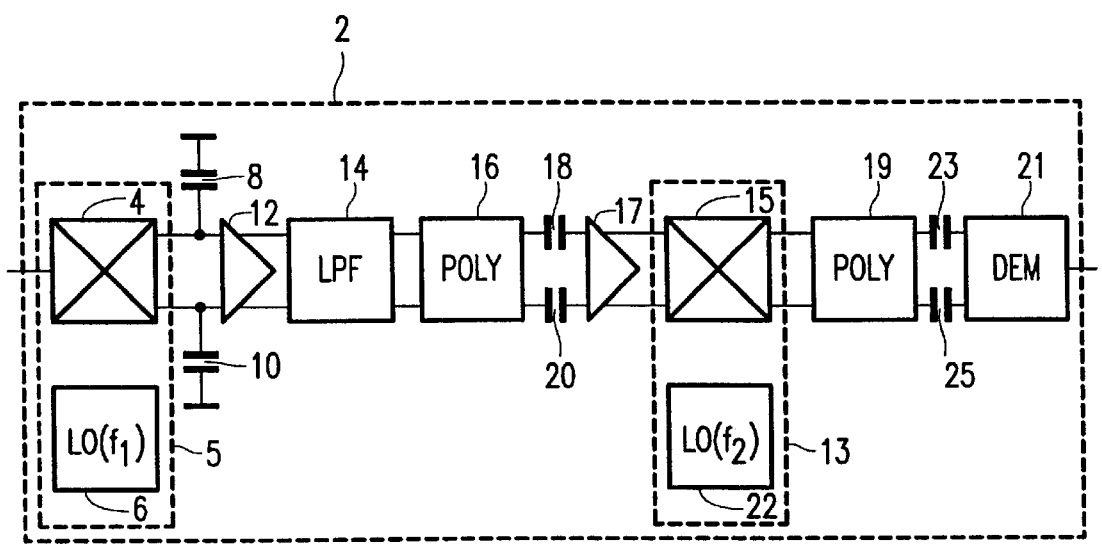
FIG. 1, a block diagram of a receiver according to the invention.

An input of the receiver 2 according to FIG. 1 is connected to a first input of a mixer 4. A first output of a local oscillator 6, carrying an in-phase local oscillator signal, is connected to a second input of the mixer 4. A second output of the local oscillator 6, carrying a quadrature local oscillator signal, is connected to a third input of the mixer 4. The (first) frequency converter 5 is constituted by the combination of the mixer 4 and the local oscillator 6.

A first output of the mixer 4, carrying an in-phase component of the intermediate polyphase signal, is connected to a first terminal of a capacitor 8, and to a first input of an AGC amplifier 12. A second output of the mixer 4, carrying a quadrature component of the intermediate polyphase signal, is connected to a first terminal of a capacitor 10, and to a second input of the AGC amplifier 12. Second terminals of the capacitors 8 and 10 are connected to ground. It is observed that each of the in-phase component and the quadrature component of the intermediate signals, can be represented by a pair of balanced signals +I, −I and +Q and −Q respectively.

The outputs of the AGC amplifier 12 are connected to inputs of a low-pass filter 14. The outputs of the low-pass filter 14 are connected to corresponding inputs of the (first) polyphase filter 16. The outputs of the polyphase filter 16 are connected to inputs of a second AGC amplifier 17 via coupling capacitors 18 and 20.

The outputs of the second AGC amplifier 17 are connected to the further frequency converter 13 via coupling capacitors 18 and 20. In the further frequency converter 13 the input signals are applied to corresponding inputs of an image rejection mixer 15. Outputs of a local oscillator 22 in the further frequency converter, carrying a polyphase local oscillator signal, are connected to corresponding inputs of the image rejection mixer 15. Outputs of the image rejection mixer 15, carrying the further intermediate polyphase signals, are connected to inputs of the further polyphase filter 19. The outputs of the polyphase filter 19, carrying the further filtered polyphase signals, are connected via coupling capacitors 23 and 25 to corresponding inputs of a demodulator 21. At the output of the demodulator 21, a demodulated output signal is available.

The mixer 4 is arranged for mixing the input signal $V_{RF}$ of the receiver with an in-phase local oscillator signal, and a quadrature local oscillator signal, both being generated by a local oscillator 6. The relevant parts of the output signals of the mixer 4 are equal to $c \cdot \hat{v}_{RF} \cdot \sin(2\pi(f_{RF}-f_{LO1}) \cdot t)$ and $c \cdot \hat{v}_{RF} \cdot \cos(2(f_{RF}-f_{LO1}) \cdot t)$ respectively, wherein c is a constant, $\hat{v}_{RF}$ is the amplitude of the (sinusoidal) input signal, $f_{RF}$ is the frequency of the input signal, and $f_{LO1}$ is the frequency of the local oscillator signal. In most implementations, the quadrature signals are present in pairs of balanced signals such that the signals $-c \cdot \hat{v}_{RF} \cdot \sin(2\pi(f_{RF}-f_{LO1}) \cdot t)$ and $-c \cdot \hat{v}_{RF} \cdot \cos(2\pi(f_{RF}-f_{LO1}) \cdot t)$ are also available.

The capacitors 8 and 10 provide a first filtering of the output signals of the mixer 4 in order to suppress strong out of band signals. The AGC amplifier 12 is present to provide signals having a substantial constant amplitude at the input of the low-pass filter 14. The low pass filter 14 has a second order Butterworth transfer function with a cut-off frequency around 30 kHz. The low pass filter 14 is present to provide some adjacent channel selectivity.

The polyphase filter 16 is arranged to provide one edge of the final channel selectivity. Preferably the polyphase filter 16 has a cut off frequency of 0 Hz, resulting in a first edge at a frequency of $f_{RF}-f_{LO1}$. The output signal of the polyphase filter 18 is amplified by the AGC amplifier 18 to a reference value. The capacitors 18 and 20 are present to eliminate DC offsets from the output signal of the polyphase filter 16.

Figure 5:
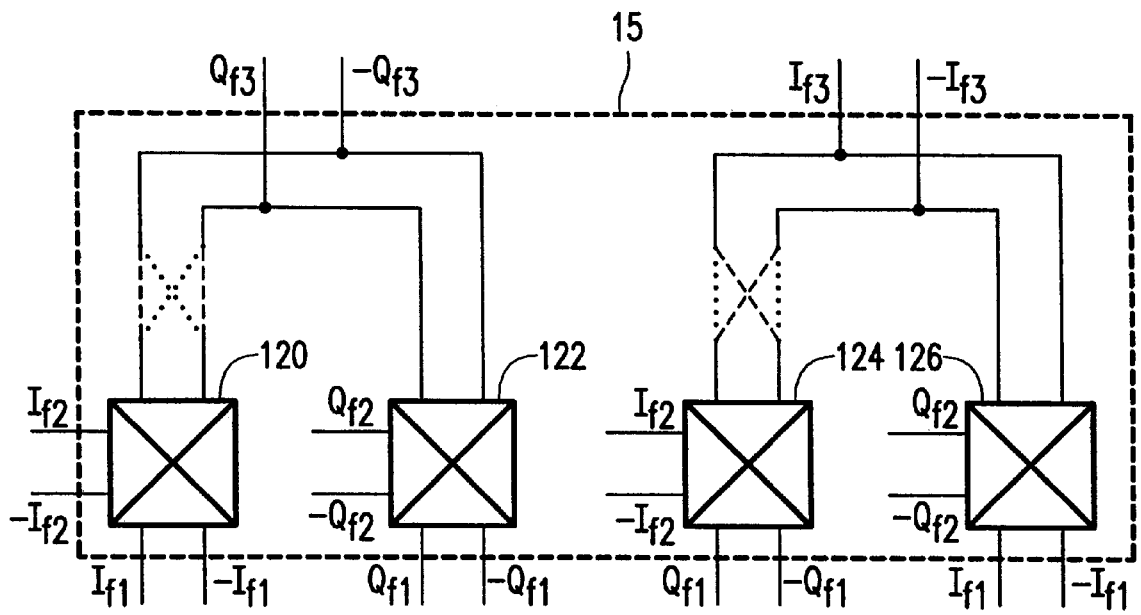
FIG. 5, an implementation of the mixer 15 in the receiver according to FIG. 1.

The output signal of the AGC amplifier 18 is mixed by the second frequency converter with a local oscillator signal with frequency $f_{LO2}$. The image rejection mixer 15 is arranged to provide only the sum or the difference frequency at its output, dependent on its internal interconnections as will be explained later with reference to FIG. 5. The output of the image rejection mixer 15 is filtered by the polyphase filter 19 to provide the second edge of the final channel selectivity. Again the cut off frequency of the polyphase filter is preferably equal to 0 Hz, resulting in a second edge at a frequency of $f_{RF}-f_{LO1}-f_{LO2}$. Consequently a bandpass characteristic is obtained with edges at $f_{RF}-f_{LOI}$, and $f_{RF}-f_{LOI}-f_{LO2}$, respectively. In the case of 0 Hz polyphase filters the accuracy of the position of said edges is not determined by the accuracy of the elements used in the polyphase filters, but only by the accuracy of the frequency of the local oscillator signals.

The output signal of the polyphase filter 19 is presented to a demodulator 21 for demodulation. The capacitors 23 and 25 are present to eliminate offsets from the output signal of the polyphase filter 19. At the output of the demodulator 21 the demodulated signal is available.

Figure 2:
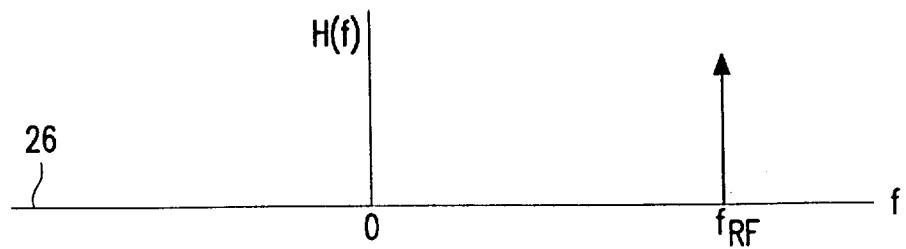
FIG. 2, a plot of the frequency spectra at different positions in the receiver according to FIG. 1.
Figure 2:
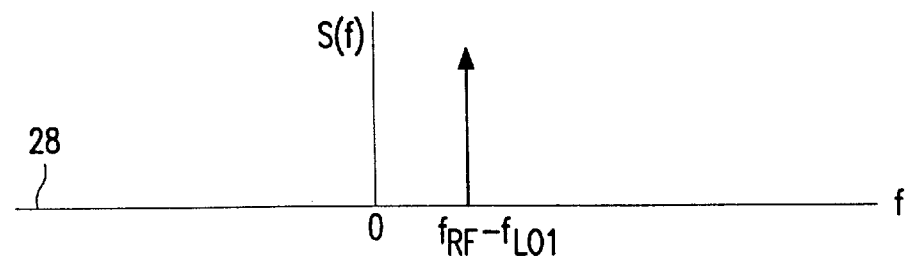
Figure 2:
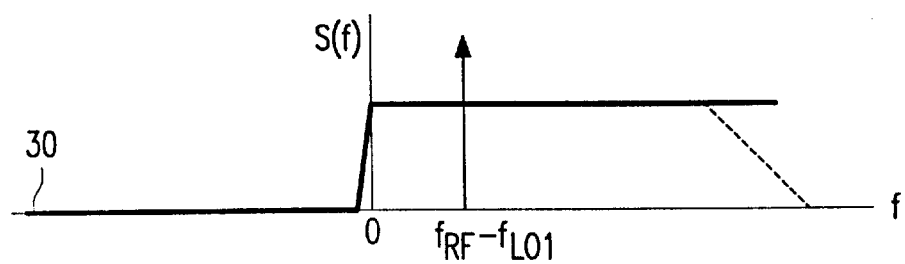
Figure 2:
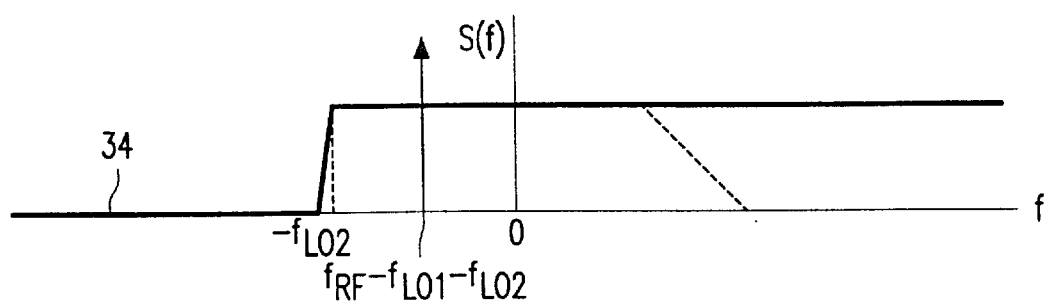
Figure 2:

FIG. 2, shows the spectra at different positions in the receiver in the case the frequency of the first local oscillator is lower than the frequency of the RF signal. Graph 26 shows the relevant parts of the frequency spectrum at the input of the receiver according to FIG. 1. For clarity it is assumed that only one signal, having a frequency $f_{RF}$, is present. In graph 28 of FIG. 2 the input signal of the first polyphase filter 16 is presented. The image signal with a frequency of $f_{RF}+f_{LO1}$ is already suppressed by the low pass filter 14. Graph 30 of FIG. 2 shows the transfer function of the first polyphase filter 16 together with the output spectrum of said polyphase filter 16. The polyphase filter 16 is in this case a polyphase high-pass filter.

Graph 34 of FIG. 2 shows the spectrum of the output signal of the image rejection mixer 15. It can be seen that the polyphase mixer 15 is arranged for providing the difference frequency between its input signal and the local oscillator 22. Finally graph 36 shows the output signal of the polyphase filter 19 in which the filtering by said polyphase filter 19 is shown. Here the polyphase filter 19 is arranged as a low-pass filter passing frequencies below 0 Hz. From graph 36 it can be seen that a band-pass characteristic is obtained by the combination of polyphase filters.

It is observed that it is not necessary that the polyphase filters are high-pass filters or low pass filters. The transfer function for frequencies beyond the edge defined by the other polyphase filter may assume arbitrary values. In practical implementations, the polyphase filters will show a band pass character, of which only one edge is used to define the transfer function of the receiver. This band-pass character is indicated by the dotted line in graphs 30 and 34. The band pass character mentioned above can also be caused by the Butterworth filter 16.

Figure 3:
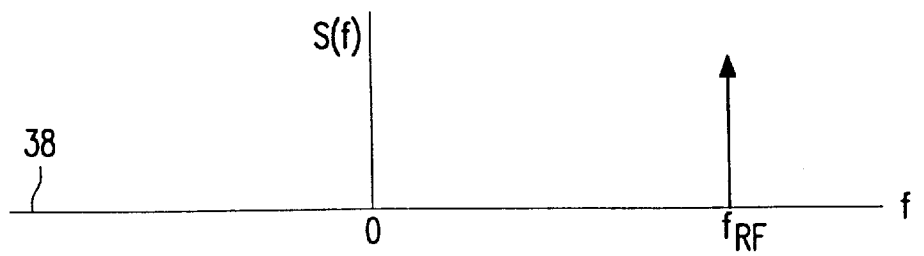
FIG. 3, a further plot of the frequency spectra at different positions in the receiver according to FIG. 1.
Figure 3:
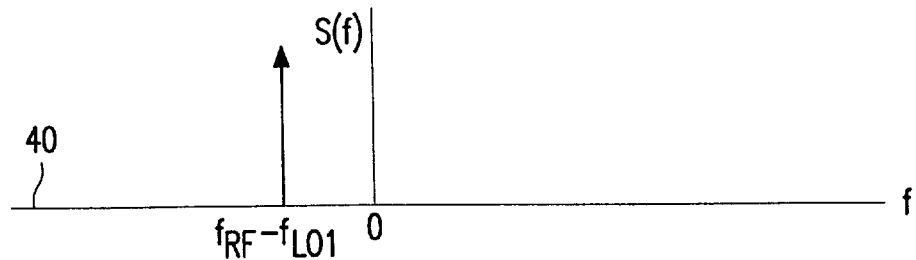
Figure 3:
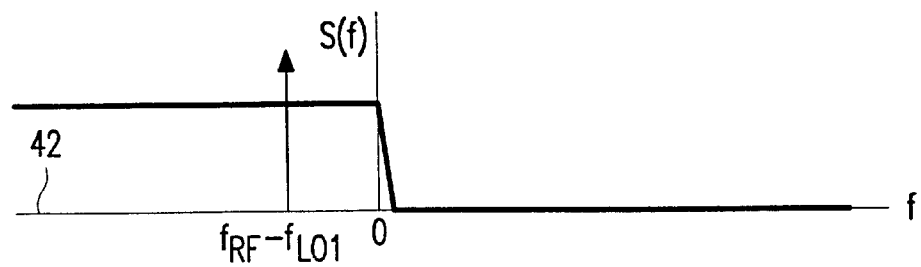
Figure 3:
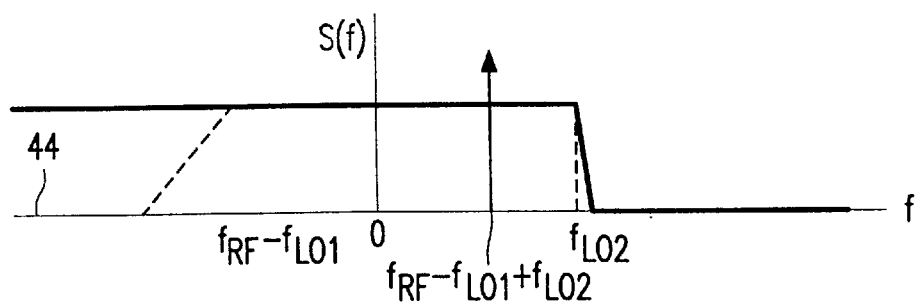
Figure 3:
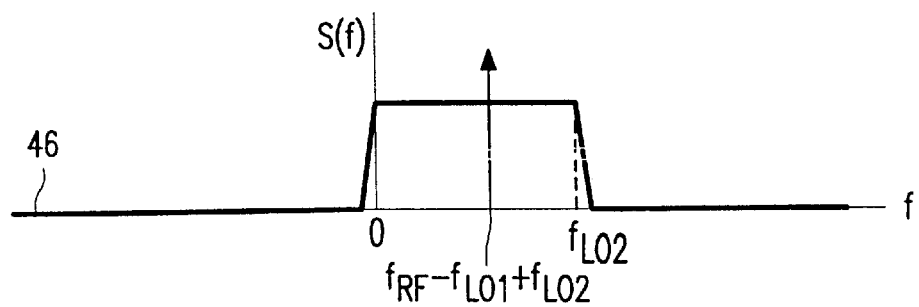

FIG. 3, shows the spectra at different positions in the receiver in the case the frequency of the first local oscillator is higher than the frequency of the RF signal. Graph 38 shows the input spectrum of the receiver. Graph 40 shows the spectrum at the output of the low-pass filter 14. Graph 42 shows the spectrum of the output signal of the polyphase filter 16. This graph shows the suppression frequencies above a given frequency. The suppressed frequencies are here the positive frequencies. Graph 44 shows the spectrum of the output signal of the image rejection mixer 15. From this graph it is clear that only the sum frequencies of the input signal and the local oscillator signal is present in the output signal of the mixer 15. Consequently the frequency spectrum has been shifted to higher frequencies. Graph 46 shows the spectrum at the output of the second polyphase filter 19, which filter is arranged for suppressing frequencies below a certain frequency.

Figure 4:
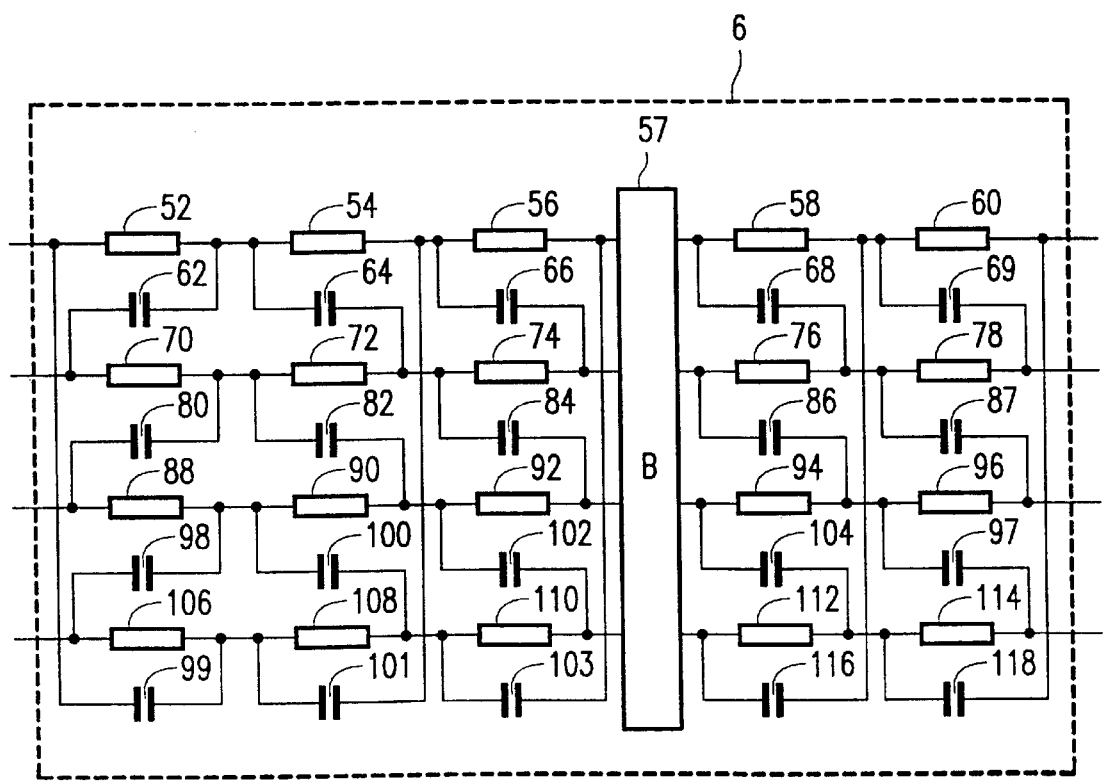
FIG. 4, an implementation of the polyphase filter 16 in the receiver according to FIG. 1.

In the polyphase filter 6 according to FIG. 4, a first (second) [third] {fourth} input, carrying a 0° (90°) [180°] {270°} signal, is connected to an first terminal of a resistor 52 (70) [88] {106} and to a first terminal of a capacitor 99 (62) [80] {98}. A second terminal of the resistor 52 (70) [88] {106} is connected to a second terminal of the capacitor 62 (80) [98] {99}, to a first terminal of a resistor 54 (72) [90] {108} and to a first terminal of a capacitor 64 (82) [100] {101}. A second terminal of the resistor 54 (72) [90] {108} is connected to a second terminal of the capacitor 101 (64) [82] {100}, to a first terminal of a resistor 56 (74) [92] {110}, and to a first terminal of a capacitor 66 (84) [102] {103}. A second terminal of the resistor 56 (74) [92] {110} is connected to a second terminal of the capacitor 103 (66) [84] {102}, and to a first (second) [third] {fourth} input of a buffer circuit 57.

A first (second) [third] {fourth} output of the buffer circuit 57, carrying a 0° (90°) [180°]{270°}signal, is connected to an first terminal of a resistor 58 (76) [94] {112} and to a first terminal of a capacitor 68 (86) [104] {116}. A second terminal of the resistor 58 (76) [94] {112} is connected to a second terminal of the capacitor 116 (68) [86] {104}, to a first terminal of a resistor 60 (78) [96] {114}, and to a first terminal of a capacitor 69 (87) [97] {118}. A second terminal of the resistor 60 (78) [96] {114} is connected to a second terminal of the capacitor 118 (69) [87] {97}, and to a first (second) [third] {fourth} output of the polyphase filter 6.

The polyphase filter 6 comprises a cascade connection of three polyphase filter sections, a buffer amplifier and two additional polyphase filter sections. The first section of the polyphase filter 6, causes a real pole for p=−200 kHz and an imaginary zero for p=+50j kHz. Consequently this first section has a low-pass transfer function. The second section of the polyphase filter 6 has a pole for p=−60 kHz and a zero for p=−46j kHz and the third filter section has a pole for p=−10 kHz, and a zero for −10j kHz. These filter sections have a high-pass transfer function.

The buffer amplifier is present to prevent excessive loading of the first three filter sections by the fourth and fifth filter sections. The fourth filter section has a pole for p=−200 kHz and a zero for −74j kHz and the fifth filter section has a pole for p=−70 kHz and a zero for p=−20 kHz . Consequently both filter sections have a high-pass transfer function. In the image rejection mixer 15 according to FIG. 5, balanced in-phase local oscillator signals $I_{F1}$ and $-I_{F1}$, are applied to a first pair of inputs of a multiplier 120 and to a first pair of inputs of a multiplier 126. Balanced quadrature local oscillator signals $Q_{F1}$ and $-Q_{F1}$ are applied to a first pair of inputs of a multiplier 122 and to a first pair of inputs of a multiplier 124.

Balanced in-phase input signals $I_{F2}$ and $-I_{F2}$ are applied to a second pair of inputs of the multiplier 120 and to a second pair of inputs of the multiplier 124. Balanced quadrature input signals $Q_{F2}$ and $-Q_{F2}$ are applied to a second pair of inputs of the multiplier 122 and to a second pair of inputs of the multiplier 126.

Balanced output signals of the multipliers 120 and 122 are connected to a first pair of output terminals carrying quadrature output signals $Q_{F3}$ and $-Q_{F3}$. The output signals of the multiplier 120 can be interchanged for purposes explained later. Balanced output signals of the multipliers 124 and 126 are connected to a second pair of output terminals carrying in-phase output signals $I_{F3}$ and $-I_{F3}$. The output signals of the multiplier 124 can be interchanged.

For the explanation of the operation of the mixer 15 it is assumed that the signals $I_{F1}$, $Q_{F1}$, $I_{F2}$ and $Q_{F2}$ are given by:

$$I_{F1}=\sin(\omega_1 \cdot t);\ Q_{F2}=\cos(\omega_1 \cdot t);\ I_{F2}=\sin(\omega_2 \cdot t);\ Q_{F2}=\cos(\omega_2 \cdot t) \quad (1)$$

Using the expressions according to (1) for the output signals of the mixers 120, 122, 124 and 126 can be found:

$$I_{120}=\cos\{(\omega_1-\omega_2)t\}-\cos\{(\omega_1+\omega_2)t\} \quad (2)$$

$$I_{122}=\cos\{(\omega_1-\omega_2)t\}-\cos\{(\omega_1+\omega_2)t\} \quad (3)$$

$$I_{124}=\cos\{(\omega_1-\omega_2)t\}-\cos\{(\omega_1+\omega_2)t\} \quad (4)$$

$$I_{126}=\cos\{(\omega_1-\omega_2)t\}-\cos\{(\omega_1+\omega_2)t\} \quad (5)$$

If the mixers 122 and 126 are connected according to the dashed lines, the output signal $Q_{F3}$ is derived by subtracting the output signal of the mixer 120 from the output signal of the mixer 122. The output signal $I_{F3}$ is obtained by adding the output signal of the mixer 124 to the output signal of the mixer 126. For $I_{F3}$ and $Q_{F3}$ is found in this way:

$$I_{F3}=2\sin\{(\omega_1+\omega_2)t\} \quad (6)$$

$$Q_{F3}=2\cos\{(\omega_1+\omega_2)t\}$$

From (6) it can be seen that only the sum frequency is present in the output signal of the mixer 15. If the outputs of the mixers 122 and 124 are connected according to the dotted lines, the output signal $Q_{F3}$ is obtained by adding the output signal of mixer 120 to the output signal of the mixer 122. The output signal $I_{F3}$ is obtained by subtracting the output signal of the mixer 124 from the output signal of the mixer 126. For the output signals is found in this way:

$$I_{F3}=2\sin\{(\omega_1-\omega_2)t\} \quad (7)$$

$$Q_{F3}=2\cos\{(\omega_1-\omega_2)t\}$$

From (7), it can be seen that now only the difference frequency is present in the output signal of the mixer. As explained above, the interconnections of the mixers 120 and 124 can be chosen to select the desired operation of the mixer 15.

Figure 6:
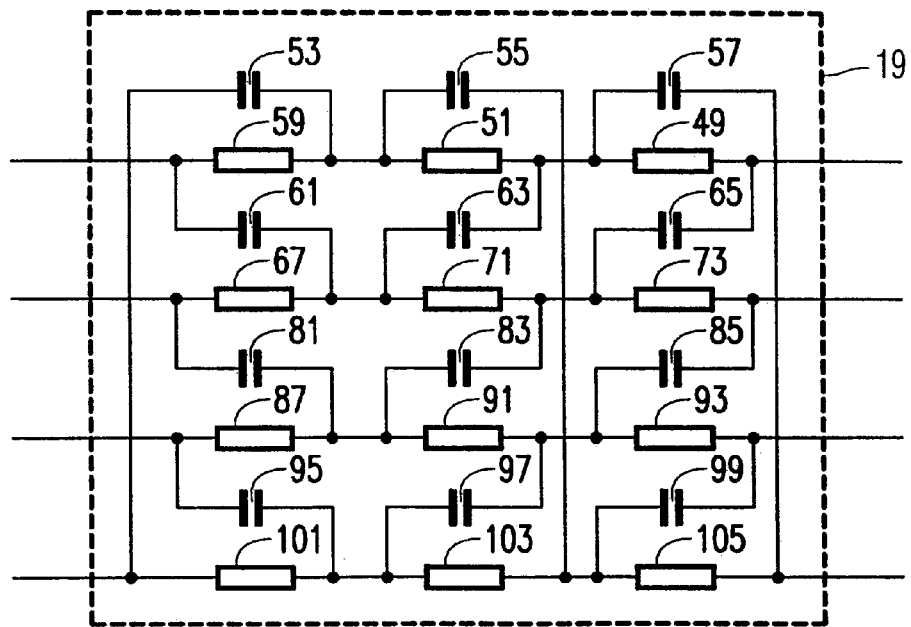
FIG. 6, an implementation of the polyphase filter 16 in the receiver according to FIG. 1.

In the polyphase filter 19 according to FIG. 6, a first (second) [third] {fourth} input, carrying a 0° (90°) [180°] {270°} signal is applied to a first terminal of a resistor 59 (67) [87] {101 } and to a first terminal of a capacitor 61 (81) [95] {53}. A second terminal of the resistor 59 (67) [87] {101} is connected to a second terminal of the capacitor 53 (61) [81] {95}, to a first terminal of a resistor 51 (71) [91] {103}, and to a first terminal of a capacitor 55 (63) [83] {97}.

A second terminal of the resistor 51 (71) [91] {103 }, is connected to an first terminal of a resistor 49 (73) [93] {105} and to a first terminal of a capacitor 57 (65) [85] {99}. A second terminal of the resistor 49 (73) [93] {105} is connected to a second terminal of the capacitor 65 (85) [99] {57} and to a first (second) [third] {fourth} output terminal. The polyphase filter 19 comprises a cascade connection of three passive first order sections. The first section has a pole for p=−200 kHz and a zero for p=−74j. This section has a high-pass transfer function. The second section has a pole for p=−120 and a zero for p=+40j, and the third section has a pole for p=−75 and a zero for p=−25j. The second and third filter sections show a low-pass transfer function. With the implementation of the polyphase filters 14 and 19 as explained above, the polyphase mixer 15 has to be set to obtain the difference frequency, leading to frequency spectra in the receiver according to FIG. 2.

What is claimed is:

1. A Receiver comprising:
   a frequency converter for deriving from an input signal of the receiver a plurality of intermediate polyphase signals,
   a polyphase filter for deriving filtered polyphase signals from the intermediate polyphase signals,
   a further frequency converter for deriving a plurality of further intermediate polyphase signals from the filtered polyphase signals, and
   a further polyphase filter for deriving further filtered polyphase signals from the further intermediate polyphase signals, one of the polyphase filter and the further polyphase filter being arranged for attenuating signals above a first frequency, and another of the polyphase filter and the further polyphase filter being arranged for attenuating signals below a second frequency, wherein said first frequency and said second frequency are substantially zero so that said polyphase filter, said further frequency converter and said further polyphase filter form a bandpass filter having a cut off frequency that does not depend on values of components of said polyphase filter and said further polyphase filter, and is determined by said local oscillating frequency of said further frequency converter.

2. Receiver according to claim 1, wherein the polyphase filter and the further polyphase filter comprise passive filters.

3. Receiver according to claim 1, wherein the polyphase filter and the further polyphase filter comprise passive filters using capacitors and resistors.

4. Receiver according to claim 1, wherein the further frequency converter comprises image rejection mixing means.

5. Filter arrangement comprising:
   a frequency converter for deriving from an input signal of the receiver a plurality of intermediate polyphase signals,
   a polyphase filter for deriving filtered polyphase signals from the intermediate polyphase signals,
   a further frequency converter for deriving a plurality of further intermediate polyphase signals from the filtered polyphase signals, and
   a further polyphase filter for deriving further filtered polyphase signals from the further intermediate polyphase signals, one of the polyphase filter and the further polyphase filters being arranged for attenuating signals above a first cut off frequency, and another of the polyphase filter and the further polyphase filter being arranged for attenuating signals below a second cut off frequency, wherein said first cut off frequency and said second cut off frequency are substantially zero so that said polyphase filter, said further frequency converter and said further polyphase filter form a bandpass filter having a bandpass cut off frequency that does not depend on values of components of said polyphase filter and said further polyphase filter, and is determined by said local oscillating frequency of said further frequency converter.

6. Filter arrangement according to claim 5, wherein the polyphase filter and the further polyphase filter comprise passive filters.

7. Filter arrangement according to claim 5, wherein the polyphase filter and the further polyphase filter comprise passive filters using capacitors and resistors.

8. Filter arrangement according to claim 5, wherein the further frequency converter comprises image rejection mixing means.

9. A receiver comprising:
   a first frequency converter which converts a frequency of a received signal to a first converted frequency to form a first intermediate frequency signal;
   a first polyphase filter having a polyphase filter cut-off frequency to filter said first intermediate frequency signal and form a first filtered signal;
   a second frequency converter having a local oscillating frequency to convert said first filtered signal to a second intermediate frequency signal having a second intermediate frequency; and
   a second polyphase filter having said polyphase filter cut-off frequency to filter said second intermediate frequency signal;
   wherein said polyphase filter cut-off frequency is substantially zero so that said first polyphase filter, said second frequency converter and said second polyphase filter form a bandpass filter having a bandpass cut off frequency that does not depend on values of components of said first polyphase filter and said second polyphase filter, and is determined by said local oscillating frequency of said second frequency converter.

10. The receiver of claim 9, wherein said first polyphase filter and said second polyphase filter comprise passive filters.

11. The receiver of claim 9, wherein said first polyphase filter and said second polyphase filter comprise passive filters using capacitors and resistors.

12. The receiver of claim 9, wherein said second frequency converter includes an image rejection mixer.

* * * * *